United States Patent [19]
Wang et al.

[11] Patent Number: 6,025,462
[45] Date of Patent: Feb. 15, 2000

[54] REFLECTIVE AND CONDUCTIVE STAR POLYMERS

[75] Inventors: Fei Wang, Mansfield; R. David Rauh, Newton, both of Mass.

[73] Assignee: EIC Laboratories, Inc., Norwood, Mass.

[21] Appl. No.: 09/033,882

[22] Filed: Mar. 3, 1998

Related U.S. Application Data

[60] Provisional application No. 60/040,509, Mar. 6, 1997.

[51] Int. Cl.[7] .................................................. C08G 15/00
[52] U.S. Cl. ......................... 528/377; 528/378; 528/373; 528/422; 252/500
[58] Field of Search .................................... 528/377, 378, 528/373, 422; 252/500

[56] References Cited

U.S. PATENT DOCUMENTS

| | | |
|---|---|---|
| 4,435,548 | 3/1984 | Tomalia et al. . |
| 4,507,466 | 3/1985 | Tomalia et al. . |
| 4,558,120 | 12/1985 | Tomalia et al. . |
| 4,568,737 | 2/1986 | Tomalia et al. ........................ 528/332 |
| 4,587,329 | 5/1986 | Tomalia et al. ........................ 528/363 |
| 4,631,337 | 12/1986 | Tomalia et al. . |
| 5,041,516 | 8/1991 | Frechet et al. . |
| 5,070,183 | 12/1991 | Kim . |
| 5,145,930 | 9/1992 | Kim . |
| 5,183,862 | 2/1993 | Figuly . |
| 5,225,522 | 7/1993 | Turner et al. ........................... 528/361 |
| 5,264,543 | 11/1993 | Kim . |
| 5,270,402 | 12/1993 | Figuly . |
| 5,346,984 | 9/1994 | Hasegawa et al. ...................... 528/323 |
| 5,370,825 | 12/1994 | Angelopoulos et al. ............... 252/500 |
| 5,482,655 | 1/1996 | Vogel et al. ........................... 252/500 |
| 5,530,092 | 6/1996 | Meijer et al. ........................... 528/363 |

OTHER PUBLICATIONS

McCullough et al., J.Am.Chem.Soc. 115, 4910–4911 (1993).
Chen et al., J.Am.Chem.Soc. 117, 233–244 (1995).
Risch et al., Polymer 34, 2330–2343 (1993).
Service, Science 226, 1808 (1994).
Kim et al., J.Am.Chem.Soc. 112, 4592–4593 (1990).
Miller et al., J.Am.Chem.Soc. 115, 356–357 (1993).
Dagani, Chem.Eng.News, Jun. 3, 1996, pp. 30–38.
Tomalia, Adv.Mat. 6, 529–539 (1994).
Tomalia et al., Angew.Chem.Int.Ed.Engl. 29, 138–175 (1990).
Hart et al., J.Am.Chem.Soc. 180, 6675–6679 (1986).
Sotzing et al., Chem.Mater. 8, 882–889 (1996).
MacDiarmid et al., Mat.Res.Soc.Symp. 328, 133 (1994).
Kim & Webster, Macromolecules 25, 5561–5572 (1992).
McCullough et al., J.Am.Chem.Soc. 115, 4910 (1993).
Winokur et al., Macromolecules 24, 3812–3815 (1991).
McCullough et al., J.Org.Chem. 58, 904–912 (1993).
McCullough, Adv.Mater. 10, 93–116 (1998).
Duan et al., J.Am.Chem.Soc. 117, 10783 (1995).

*Primary Examiner*—Duc Truong

[57] ABSTRACT

Conductive polymers having a star structure comprising a central core with multiple attachment sites and conjugated charge transporting arms radiating therefrom. The cores are derived from hyperbranched polymers, dendrimers, or other molecules with a multiplicity of attachment sites. The arms are derived from conjugated oligomers and polymers such as polythiophene, polyaniline or polyphenylene. The subject polymers allow assembly of the macromolecules in all three dimensions in the solid state. A ramification of the compact assembly is the realization of highly reflective, smooth coatings simply applied from solution. A preferred embodiment having a 1,3,5 hyperbranched polyphenylene core and poly (3-hexylthiophene) arms provides lustrous reflective gold coatings.

15 Claims, 6 Drawing Sheets

REFLECTIVE AND CONDUCTIVE STAR POLYMERS

This application claims benefit of Provisional Application 60/040,509, filed Mar. 6, 1997.

This invention was made with government support under Contract No. F33615-96-C-5069 awarded by the U.S. Department of the Air Force. The Government has certain rights to this invention.

FIELD OF INVENTION

This invention relates to macromolecules which are electrically conductive and which can also have reflective optical properties when applied as coatings. The invention specifically encompasses macromolecules having a core with multiple branching points and conjugated charge-transporting chains radiating outwards from the branching points.

BACKGROUND OF INVENTION

The field of electronically conductive polymers has advanced rapidly during the last 20 years with numerous examples of prior art. While most organic polymers exhibit negligible electronic conductivity of less than $10^{-12}$ reciprocal ohm centimeters (i.e., Siemans/cm), some polymers exhibit electrical conductivity or semiconductivity, however. Conductivity values for such polymers have been demonstrated from $10^{-10}$ to $10^6$ S/cm, covering the range associated with semiconductors and conductive filled composites, at the lower end, to metals at the higher end.

Polymers with intrinsic electrical conductivity or semiconductivity are of interest as lightweight replacements for inorganic metals and semiconductors. Of further significance is that they may be processible at temperatures normally associated with polymers, that is about 100–400 degrees centigrade. In addition, conductive polymers have the prospect to replace metal coatings, but which may be applied by economical non-vacuum processes such as from solution or from the melt. Furthermore, organic conductive and semiconductive polymers may be synthetically tailored to optimize desirable properties such as melting point, melt viscosity, solubility, electrical and thermal conductivity, optical and microwave reflectance and absorbance, electroluminescence, electrochromism, and linear and non-linear optical refractive index. Semiconducting polymers with conductivity on the low end of the range but with bandgaps corresponding to visible wavelengths have been used in light emitting diode (LED) and laser structures.

In general, conductive/semiconductive polymers consist of a backbone of repeating monomer units with extended pi electron delocalization. Examples of backbones that are popular for forming conductive or semiconductive polymers are:

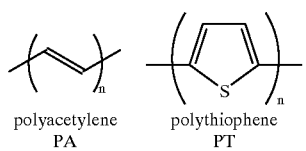

polyacetylene  polythiophene
PA             PT

-continued

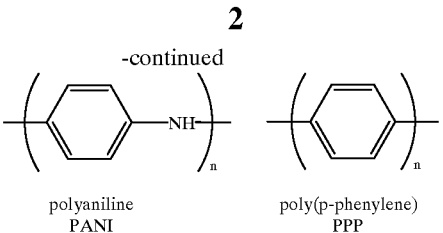

polyaniline       poly(p-phenylene)
PANI              PPP

Prior art describes many variations of these simple backbones, for example materials which are monodisperse (i.e., all polymer chains are the same) or which have different monomer substitution patterns to enhance selected chemical, mechanical, optical or electrical properties. These are only examples of prior art, as numerous other repeated pi conjugated systems have been described as having electrically conductive properties. Favorable electrically conductive properties are frequently observed not only in polymers with hundreds or thousands of repeating units, but also in oligomers with 4 to 10 repeating units.

Conductive/semiconductive polymers may be employed either in their unmodified state or they may be "doped" to enhance their electrical conductivity. Doping a conductive polymer entails chemically treating the backbone to produce mobile charge carriers. Frequently this involves partial oxidation or reduction of the chain. In the case of polythiophene, for example, oxidation of the chain by exposure to oxidants such as $I_2$ results in an oxidation-reduction reaction which produces mobile positive charges on the backbone and charge compensating anions such as $I^-$, the latter being retained in the solid polymer matrix. Other conductive polymers, such as polyacetylenes, may be doped by treatment either with reducing agents or with oxidizing agents. Still another class of conductive polymers such as the polyanilines may be doped by protonation with acids rather than by oxidation-reduction, such protonations leading to structural rearrangements that produce mobile positive charges on the extended pi backbone.

It is evident from the examples that conductive polymers of prior art are essentially linear chain oligomers and polymers. When these polymers are aggregated in the solid state overall charge transport is thought to depend both on the mobility of the charge along the backbone and, particularly, on the ability of the charge to hop from chain to chain. This intermolecular charge transfer will be enhanced by short intermolecular separation distances and by overlap between the pi systems. Structural disorder is to be avoided because charge can become trapped within inhomogeneous regions of the solid matrix where intermolecular separation is large and/or pi overlap is small. Therefore, the conductive or semiconductive properties of a conductive polymer will be enhanced by long range ordering of the polymers in the solid state. Polymer structures are therefore desired which promote such long range ordering and also intermolecular spacings and pi overlap which favor interchain charge hopping.

An example where structural manipulation has been used in prior art to enhance the solid state structural order and the resulting conductivity is in the preparation of so-called poly(3-alkylthiophenes) or PATs that are regioregular (R. D. McCullough et al., Journal of the American Chemical Society 113, 4910 (1993) and references cited therein; T. Chen, R. D. Rieke, J. Am. Chem. Soc. 114, 10087 (1992)). When the PATs are synthesized by standard polymerization reactions, the polymer is a mixture of the three linking patterns shown below:

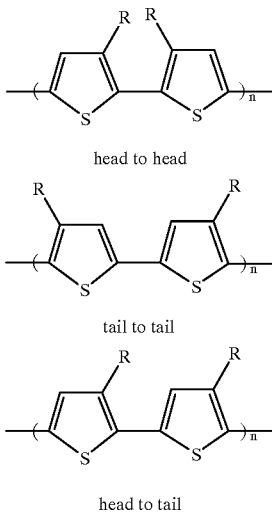

head to head tail to tail head to tail where R represents the alkyl group. Synthetic methods have been developed so that the rings are connected exclusively in the head-to-tail (h-t) fashion, and these "regioregular" polymers are referred to as "rPATs". In the randomly coupled PATs the interaction between the alkyl side chains leads to structural disorder and reduces the length of the structures in the solid state over which charge can travel before being trapped or retarded by defects. By contrast, thin films cast with the rPATs are known to self-assemble to give a highly ordered structure. The rPAT films cast from solution give a sharp x-ray spectrum while no x-ray spectrum is observed for the randomly structured analogs. The visible spectral absorption maximum both in solution and the solid state occur at a longer wavelength (lower energy) for the rPATs indicating a greater effective conjugation length through intermolecular interactions of the polymer chain compared with the irregular PATs. The electrical conductivity of the rPAT films is 2 orders of magnitude higher than films made with the nonregiospecific PATs. X-ray and microscopic analysis indicate that the PATs assemble in two dimensional sheets, which is manifested as a laminar morphology in thin films cast from solution. As a result, the electrical conductivity is higher in the plane of the sheets (parallel to the substrate) than it is through the sheets (perpendicular to the substrate). The laminar morphology produces a rough texture to films cast from rPATs.

Regioregularity may apply to other polymer chains, for example 3-substituted polypyrroles and to 1,4 polythiophenes.

In another example of prior art, an electrically conducting dendrimer has been reported by R. G. Duan, L. L. Miller, and D. A. Tomalia, J. Am. Chem. Soc. 117, 10783 (1995). Films 3–5 μm thick of a poly(amidoamine) dendrimer with naphthalene diimide anion radicals on its periphery were cast from formamide. The electronic conductivity of the films was as high as $6 \times 10^{-2}$ Siemans/cm. The conduction path is along the π-stacks that were formed in contrast to the traditional conducting polymers where the conducting path is based on alternating single and double bonds p-conjugated organic system. Significantly, because the dendritic structure can form the p-stacks in three dimensions, the conductivity was isotropic rather than anisotropic as is usually observed in other conductive, layered systems. While demonstrating a principal of three dimensional conduction, these materials do not take advantage of the capabilities of existing conducting polymers or of the variety of conjugated organic structures that can be formed.

It is therefore an object of this invention to provide a new class of conductive and semiconductive polymers, defined herein as "star conductive polymers", that can self-assemble into three dimensional solids similar to most metals but which employ linear conducting polymer structural units.

It is a further object of the invention to provide conductive polymers that form highly smooth coatings when cast from solution because the components can assemble in three dimensions rather than two dimensions.

It is a further object of the invention to provide star conductive polymers which can be doped by oxidative, reductive or protonation processes already established for the linear conducting polymer units.

Other objects and advantages of the invention will become apparent from the description of the invention which follows, made with reference to the drawings.

SUMMARY OF THE INVENTION

Novel materials are revealed herein comprising star polymers which have arms of linear conducting polymers. The materials have two fundamental components:

1. A core structure providing a multiplicity of branching points
2. Conjugated backbone chains radiating from the branching points forming electrically conducting or semiconducting arms.

Such structures are a departure from the prior art teachings regarding conductive polymers in which a conjugated backbone of linearly repeating conjugated units provides the fundamental structural unit. The new materials constrain the conducting chain units to point in a multiplicity of directions in the solid state. In this way assembly of the solid state also proceeds in three dimensions. Furthermore as described by example herein the conducting chains surprisingly can provide sufficient intermolecular overlap to give solid materials with electrical conductivities as high or higher than the corresponding linear, non-star conductive polymers.

The materials that form the first component of this invention belong to a general class of molecules known as "star polymers". The star polymers have a central core and multiple polymer chains emanating from it. The three dimensional structure of star polymers gives them different properties from typical two-dimensional, linear chain polymers. For example, nylon-6 with a star structure has a melt viscosity and crystallization half-times that are substantially reduced by the branching (B. G. Risch, G. L. Wilkes, J. M. Warakomski, Polymer 34, 2330 (1993)). The regular three dimensional structure of star polymer gels combines the properties of hardness and flexibility and is being investigated to make materials that are hard without being brittle (R.F. Service, Science, 226, 1808 (1994)). The combination of star polymer and conductive polymer structures open up an approach to making materials that have the favorable properties of both, i.e., improved processibility and electrical conductivity. Improved processibility results from the spheroidal structure of hyperbranched, dendrimeric and starburst polymers. Thus compared to linear chain polymers, spheroidal polymers can provide materials with reduced viscosity and melting point, higher solubility and enhanced substrate penetration as coatings.

The core consists of a moiety with multiple branching points. Cores may be made from hyperbranched polymers, dendrimers, or from other symmetric or semi-symmetric molecules which have multiple attachment sites.

Figure 1:
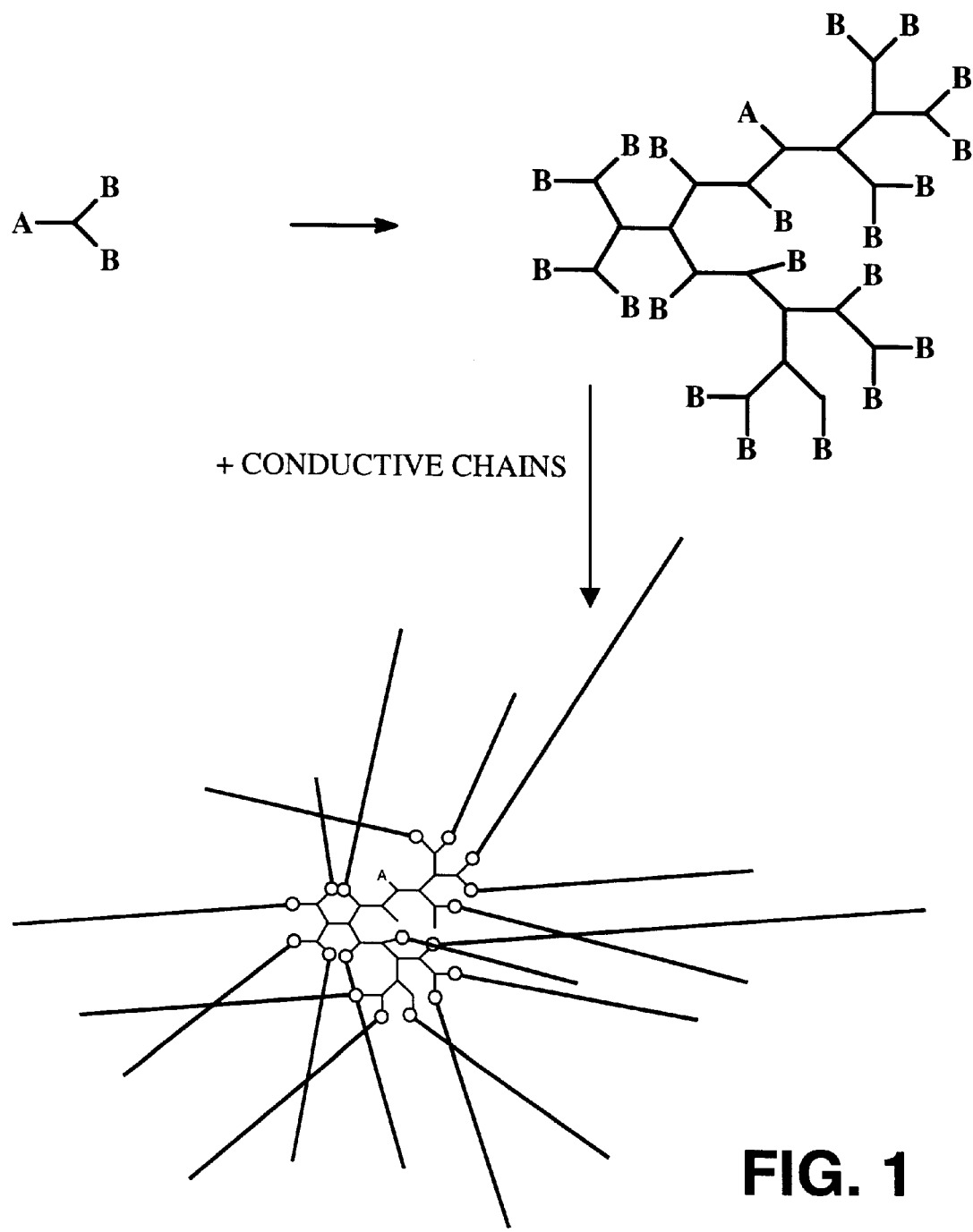
FIG. 1 is a schematic representation of a polymer structure formed by a first step producing a hyperbranched core having a multiplicity of branching points and a second step of growing conducting polymer chains from attachment sites on the hyperbranched polymer core.

Hyperbranched polymers, as the term is used for the purpose of this invention, arise from the polymerizaton of ABx type monomers, where x is 2 or greater. This type of monomer will produce highly branched polymers with one unreacted A functional group and $(x-1)n+1$ unreacted B functional groups at the surface of the polymer, where n is the degree of the polymerization. Such a core is illustrated schematically in FIG. 1. The unreacted B functional groups serve, in this invention, as points of attachment for the growth of linear conductive polymer chains. Formation of hyperbranched polymers is carried out in an "uncontrolled" way so that there will be a distribution of molecular weights in the final product. The polymer branching plays an important role in determining the chemical and mechanical properties of these hyperbranched materials. It can also have a large effect on the polymer's solubility, crystallinity and viscosity. For example, whereas linear polyphenylene and polyetherketone are crystalline materials insoluble in most organic solvents, the hyperbranched polyphenylene (Y. H. Kim and O. W. Webster, J. Am. Chem. Soc. 112, 4592 (1990)) and polyetherketone (T. M. Miller, T. X. Neenan, E. W. Kwock, S. M. Stein, J. Am. Chem. Soc. 115, 356 (1993)) are very soluble in common organic solvents.

Examples of hyperbranched polymers that are suitable as core structures include polyesters (U.S. Pat. Nos. 5,183,862; 5,225,522; 5,270,402), aramids (U.S. Pat. No. 5,264,543), nylons (U.S. Pat. No. 5,346,984), and polyarylenes (U.S. Pat. Nos. 5,070,183; 5,145,930).

Figure 2:
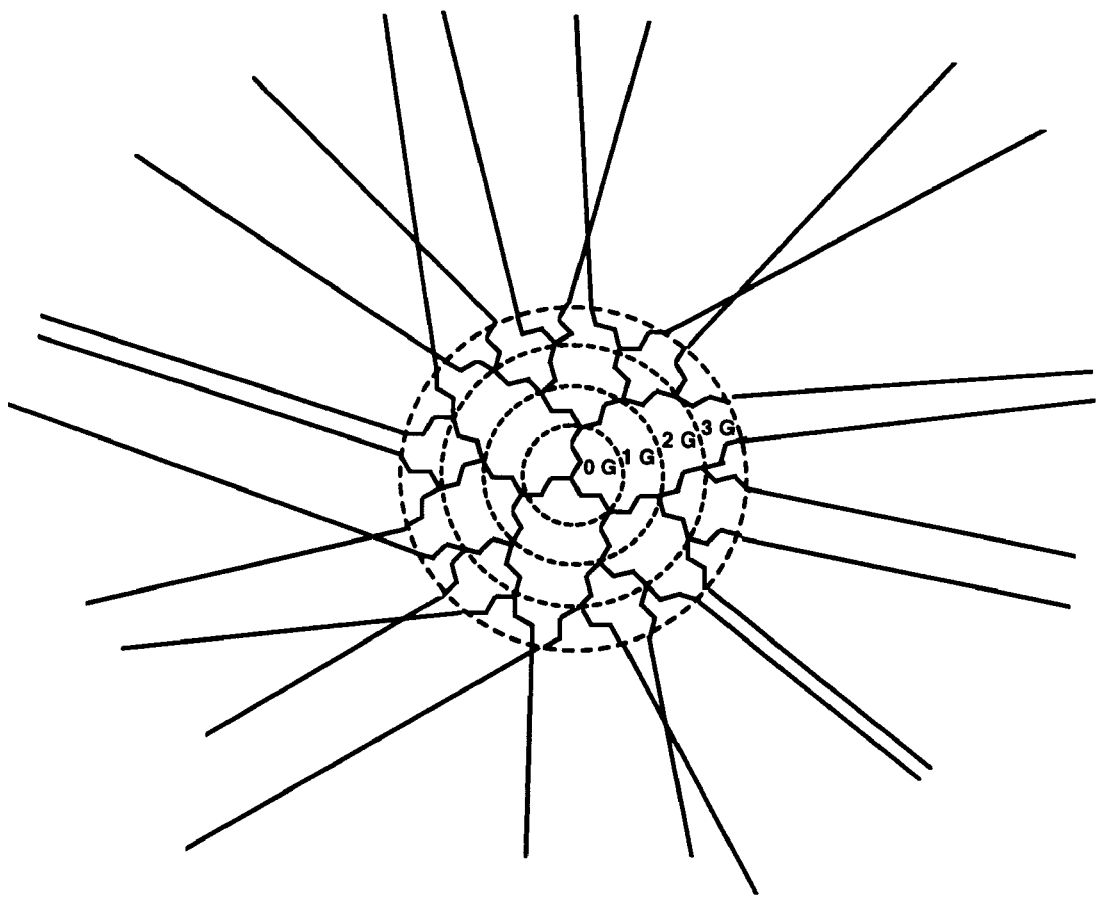
FIG. 2 is a schematic representation of a polymer structure formed from a third generation dendrimer core with conductive polymer arms radiating from attachment sites on the core surface.

Yet another core structure can be derived from a dendrimer. Dendrimeric polymers have been described extensively in prior art (see reviews by Tomalia, *Advanced Materials* 6, 529 (1994); Angew. Chem. Int. Ed. Engl. 29, 138 (1990)). For the purposes of this invention, dendrimers shall be defined as branched macromolecules are "monodisperse" with respect to their molecular weight. Most methods to produce dendrimers employ a technique of repeated protection and deprotection steps to build up the dendritic structure. The two most important synthetic approaches are referred to as the divergent and the convergent methods. The divergent approach begins from a core and builds up the molecules outwards, generation by generation. The convergent method builds up dendritic molecules from the outside layer inwards, with the final step linking several big dendrimers together. Dendrimers made by these techniques have precisely controlled molecular structures and very few defects. The last group added to the dendrimer in the divergent method, or the terminal group in the convergent method, may be equipped with a functionality for linking a conductive polymer chain either directly or through a series of subsequent reaction steps. FIG. 2 shows a dendrimer with three "generations" of branching with end groups derivatized with a conductive polymer chain.

Examples of dendrimers include polyamidoamines (U.S. Pat. Nos. 4,435,548; 4,507,466; 4,558,120), polyethylenimines (U.S. Pat. No. 4,631,337), iptycenes (Hart et al., J. Am. Chem. Soc.108, 6675 (1986) and aromatic polyethers (U.S. Pat. No. 5,041,516).

Other molecules with multiple branching points may be employed as cores. An example is the fullerene class, $C_{60}$, $C_{70}$, etc., derivatized along the outer shell with suitable attachment sites such as —OH.

In accordance with an object of this invention, the arms attached to the central core may be drawn from the entire catalog of prior art conductive and semiconductive oligomer and polymer chains. These include side arms of polyaniline, polythiophene, polyphenylene, polypyrrole, polyacetylene, polyisothionaphthene, polyaniline, polyethylenedioxythiophene (PEDOT), poly(phenylenevinylene), substituted derivatives thereof and co-polymers thereof. An example of an alternating co-polymer is bis-EDOT-arylene described in prior art as an easily doped conjugated polymer with a low oxidation potential (G. A. Sotzing, J. R. Reynolds, P. J. Steel; Chem. Mater. 8, 882 (1996)). A conductive star polymer may also be constructed in which two or more different conjugated arms radiate from the center core.

The conductive star polymers may be used in their undoped state for applications in which the conductivity requirements are not too high, for example static dissipation, or where the optical property of the polymer coating, is of chief importance, for example as a pigment or reflective layer. Materials with conductivities in the range of $10^{-6}$ to 1 S/cm may be suitable for these purposes.

Doping of the conductive star polymers to increase the electrical conductivity may be achieved using methods of prior art applicable to the conjugated radiating chain moieties. For conjugated chains based on pyrrole or thiophene units or derivatives thereof doping may be achieved by treatment with oxidizing agents. Oxidizing agents include iodine, ferric chloride, ferric tosylate ($Fe[Tos]_3$), gold trichloride ($AuCl_3$), antimony chloride ($SbCl_5$), nitrosonium tetrafloroborate ($NOBF_4$).

Doping reactions can be carried out both in solution and in the solid state. The reduced species in these processes, such as $Fe^{2+}$, $SbCl_3$, and $AuCl_2^-$, can be easily washed away. $(NO)BF_4$ will produce $N_2O_2$ as a gas and evaporate from the polymer. Counterions then remain in the polymer to balance the positive charge, for example tosylate, $SbCl_6^-$, $BF_4^-$ and $AuCl_4^-$.

If the polymer side chains are composed of polyaniline or substituted polyaniline units, doping can be achieved by treatment with acid, see for example A. G. MacDiarmid and A. J. Epstein, Materials Research Society Symposium Proceeding Volume 328, p. 133 (1994).

Doping can also be achieved electrochemically by confining the polymer to an electrode surface and subjecting it to an oxidizing or reducing potential in an electrochemical cell. In this way, doped thin films on conductive substrates are obtained. The electrolyte provides a source of charge compensating ions flowing in and out of the film accompanying the oxidation or reduction reaction. Applications of conductive polymers in batteries, supercapacitors and electrochromic displays frequently entail doping of the polymer by such an electrochemical process.

The counterions left in the solid material may be purposely selected to influence the properties of the final doped material. For example, it is anticipated that polymeric anions will foster improved doped state melt processability. Thus, for example, the ferric salt of polystyrene sulfonic acid may be used as an oxidative dopant, the polystyrene sulfonate anions forming an ionic complex with the doped star conductive polymer structure. The ferric polystyrene sulfonate may be prepared by ion exchange, for example. Similarly, electrochemical doping may be performed in a solution of the polymeric anion or cation.

Dendritic or hyperbranched polyanions may also be employed as counterions. The commercially available Starburst™ PAMAM dendrimers are available with sodium carboxylate as the surface functional group. The generation 1.5 has 16 COONa functional groups while generation 2.5 has 32. As with the polystyrene sulfonic acids, the salts of these dendrimers with oxidizing cations such as ferric may be employed as dopants to form intimate composites.

DESCRIPTION OF PREFERRED EMBODIMENTS

To prepare representative conductive and semiconductive star polymers the core first method is used to cap a hyperbranched polymeric core with "arms" of a π-system conducting polymer. This procedure is used to form a three dimensional structure with conjugated linear polymer chains extending outwards from the core as shown schematically in FIG. 1. The hyperbranched polymeric core may be produced by way of an AB2 type of polymerization as previously described. A typical AB2 polymerization is provided in prior art of Kim (U.S. Pat. Nos. 5,070,183; 5,145,930) for producing a branched phenylene structure. A preferred embodiment which serves as an example for the general class of molecules described herein consists of such a hyperbranched polyphenylene core terminated with a linear substituted polyphenylene or polythiophene chain:

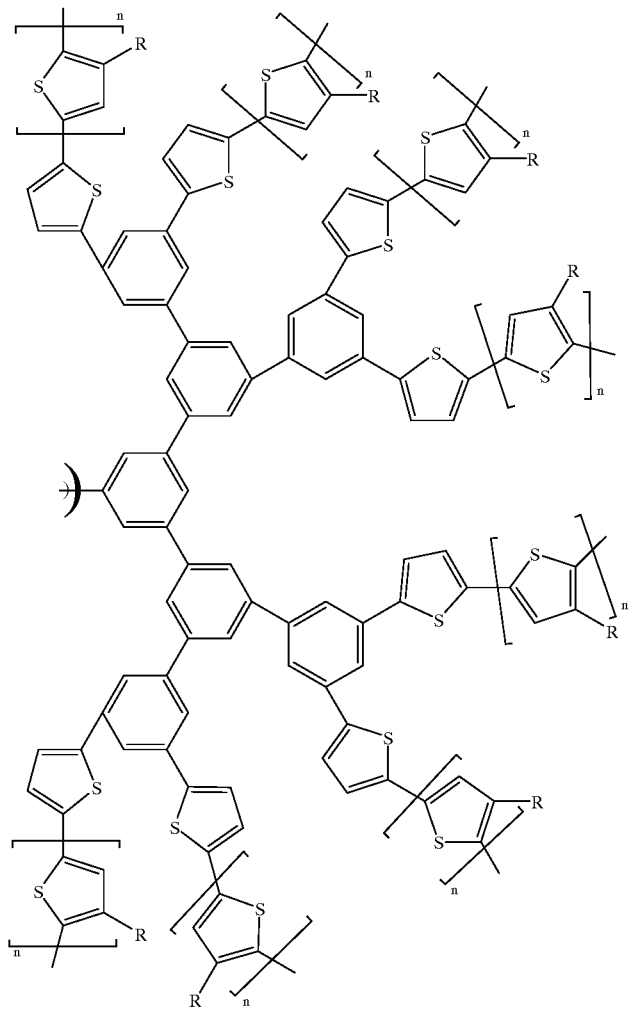

R = $C_6H_{13}$

-continued

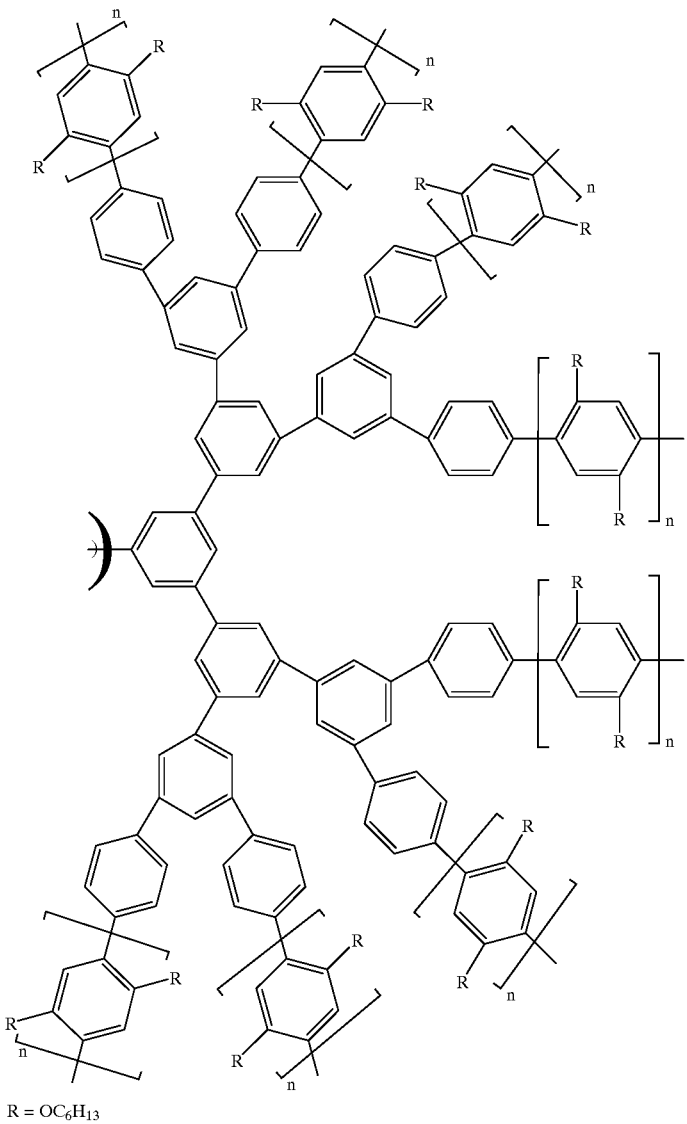

R = OC$_6$H$_{13}$

R groups represent substituents on the chain. In the case of the polythiophenes the R groups can be an alkyl group, preferably hexyl, thus producing a h-t regioregular thiophene chain. In the case of the polyphenylene chain, the R group can represent preferably an oxyhexyl substituent which has been demonstrated in prior art to produce soluble polyphenylenes.

The subject star conductive polymer materials are especially useful as coatings because of their spheroidal structure and their ability to pack in three dimensions. Coatings may be employed to impart a reflecting heat rejecting surface useful in energy conserving windows or in spacecraft exposed to solar radiation. Coatings may be used to impart surface electrical conductivity for shielding against electromagnetic radiation or for electrostatic discharge. Highly uniform layers are also required for fabricating multilayer luminescent structures such as LEDs, electroluminescent displays, lasers, field effect transistors and photocells.

Examples follow which demonstrate the synthesis and properties of the subject materials.

EXAMPLE 1

Preparation of a star polymer with a hyperbranched polyphenylene core, and with alkoxy substituted polyphenylene arms.

A star polymer with a hyperbranched polyphenylene core poly(2,5-dihexyloxyphenylene) conjugated arms was synthesized as shown in Scheme 1. Polyphenylenes have been employed extensively in organic LEDs. The synthesis of the hyperbranched polyphenylene 1 was carried out according to the procedure described in prior art by Y. H. Kim and O. W. Webster, Macromolecules 25, 5561 (1992). The hexyloxy group was introduced onto hydroquinone by the Williamson ether synthesis. Reaction with bromine gave the 2,5-dibrominated product in high yield. The dibromo compound was next reacted with one equivalent of butyllithium to give the monolithiated species. This product was then converted to the boronic acid by treatment with excess trimethylborate, followed by acid hydrolysis.

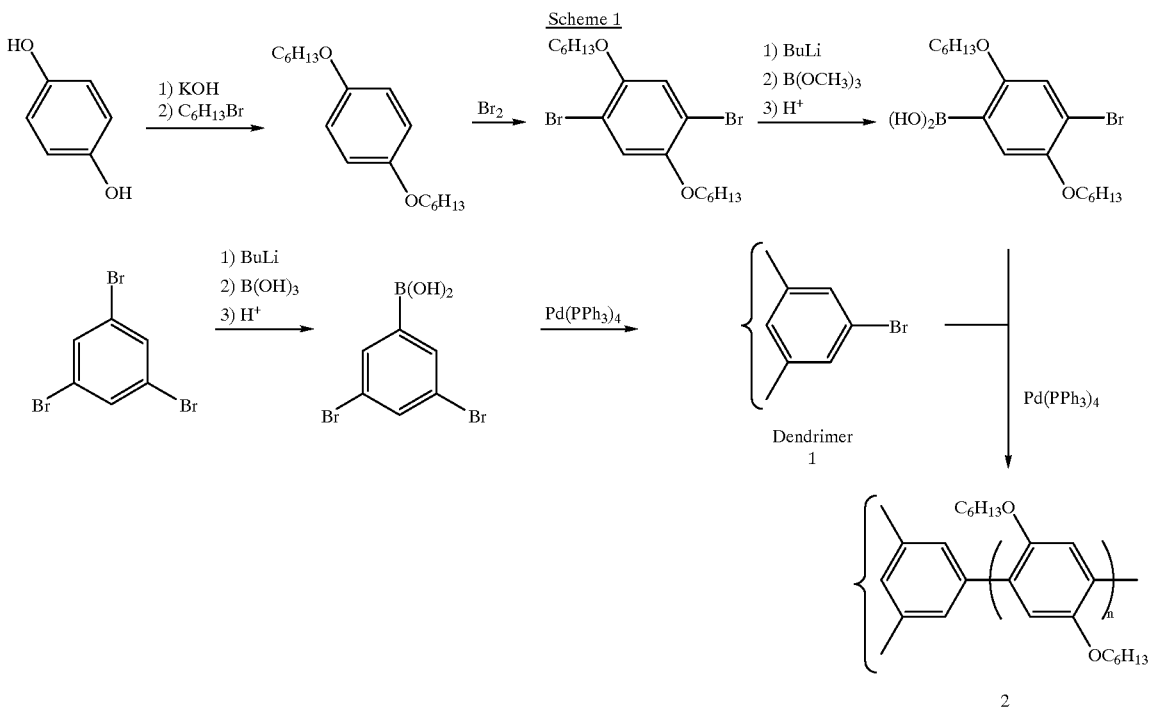

The polymerization in the presence of the dendrimer was done by a two phase, modified Suzuki coupling reaction with nitrobenzene as the organic solvent. The polymer product was recovered by precipitation in methanol. Further purification was achieved by dissolving the polymer in toluene by Soxhlet extraction followed by precipitation in methanol. A pale yellow product was obtained. The expected polymer structure of 2 was confirmed by $^1$H NMR, IR and elemental analysis. The molecular weight of the polydisperse product ranged from ~10,000 to 160,000. The product exhibited a melting transition at 68° C. (without liquification) and decomposed at ~350° C.

EXAMPLE 2

Preparation and properties of a star polymer with a hyperbranched polyphenylene core and with regioregular poly(3-hexylthioiphene) arms ("star rPHT").

The reaction steps for preparing star rPHT are described in Scheme 2. The synthesis began with the brominated hyperbranched polyphenylene core 1 described in the prior example. The polyphenylene dendrimer was next capped with bromothiophene to provide branching points for growth of the rPHT chains. This conversion was performed by coupling the polymer 1 with bromomagnesiothiophene to form the thiophene capped core 2. The $^1$H NMR spectrum of 2 shows two broad peaks from 7.4 to 8.0 ppm and 6.8 to 7.5 ppm. The peak at high ppm was assigned to protons on phenylene and the low ppm peak was assigned to protons on thiophene. The conversion from 2 to 3 was conducted by a bromination with N-bromosuccinimide. The reaction proceeded with a high yield. The NMR and elemental analysis results indicated that the bromination on thiophene was quantitative.

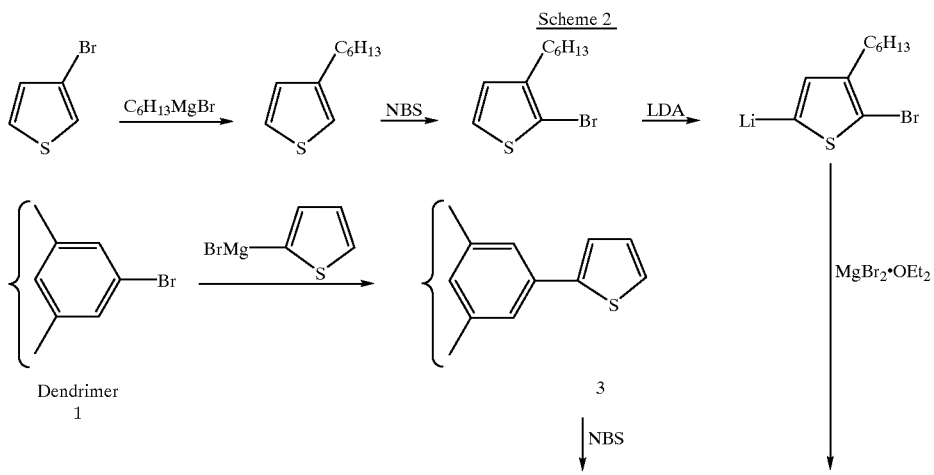

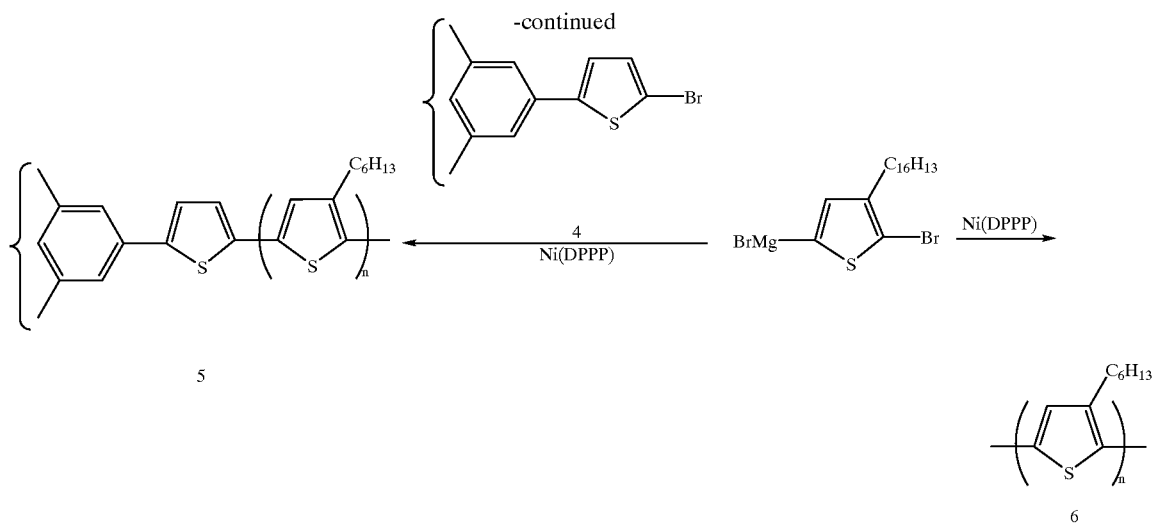

Syntheses of "star rPHT" and a comparative prior art material "linear rPHT" were conducted via the Grignard route as further described in Scheme 2. The n-hexylthiophene was prepared by a coupling reaction of 3-bromothiophene with bromomagnesiumhexane. Bromination of thiophene on the 2-position was achieved by reaction with n-bromosuccinamide in an acetic acid/chloroform mixed solvent which produced a high yield of the desired 2-bromo isomer. Lithiation selectively on the 5-position by lithium diisopropyl amide followed by treatment with magnesium bromide etherate gave a 2-bromo-5-(bromomagnesio)-3-hexylthiophene, which was used in the star polymer synthesis. The star rPHT 5 was synthesized by reaction of the dendrimer core 4 with 2-bromo-5-(bromomagnesio)-3-hexylthiophene in the presence of 0.5 mol % of [1,3-bis(diphenylphosphino)propane]nickel(II) chloride (Ni(dppp)). This condition led to the formation of a regioregular poly(3-hexylthiophene) arm star polymer. Two different monomer addition procedures were investigated. Initially, all the monomer was added in one step. Later it was added incrementally, which helped to build up the star structure gradually. A more homogeneous product was obtained by the second approach. Contamination of the star rPHT with linear (unattached) rPHT was determined by chromatographic means to be less than 20%.

The linear rPHT 6 was synthesized under the same conditions, but in the absence of the hyperbranched core 4.

Molecular Weight and Size Comparison of Star and Linear rPHT. The molecular weight of polymers may be described in terms of the number-average molecular weight Mn, determined by colligative property measurements and the weight-average molecular weight Mw, determined by light scattering. Mn is influenced more by species at the lower end of molecular weight distribution whereas Mw is particularly sensitive to the presence of high molecular weight species,. The ratio Mw/Mn is a measure of the polydispersity of the system.

The solution intrinsic viscosity is basically a measure of the size or extension in space of polymer molecules. The intrinsic viscosity and the molecular weight are related by the Mark-Houwink-Sakurada (M-H-S eq.) equation:

$$[\eta]=KM^{\alpha} \rightarrow \log[\eta]=\alpha\log[M]+\log[K]$$

A plot of $\log[\eta]$ against $\log[M]$ is a Mark-Houwink plot. The slope of the linear plot is $\alpha$ and the intercept is the $\log[K]$. K and $\alpha$ depend on the polymer structure, solvent and temperature. For most common polymers, values of $\alpha$ vary between 0.5 (for a randomly coiled polymer in a theta solvent) and close to 1.0 (for more rodlike extended-chain polymers where the hydrodynamic volume is relatively large). For many linear polymer systems, $\alpha$ lies between 0.6 and 0.8. For molecules with a compact structure, such as dendrimers and star polymers, $\alpha$ tends to be lower because of high molecular density and lower viscosity.

The molecular weights of the star and the linear rPHT polymers were measured by size exclusion chromatography (SEC) equipped with an on-line light-scattering detector, viscometer and refractive index detector. The combination of the three detectors can provide information on the absolute molecular weight, intrinsic viscosity, molecular density and generate Mark-Houwink-Sakurada plots. Typical SEC results for the star and the linear PHT materials polymer are summarized in Table 1.

For linear rPHT, the exponent $\alpha$ in the M-H-S equation was within the normal range for linear polymers. The Mark-Houwink plot for the star rPHT had a limiting of slope of 0.43, between that of a dendrimer such as PAMAM and a linear polymer. The star rPHT should have a more compact structure than a linear polymer, but not as compact as a dendrimer. An $\alpha$ value lying between these two types of polymer is expected.

TABLE 1

SEC Results for Star and Linear rPHT

|  | Mw | Mw/Mn | a (in M-H-S eq.) |
|---|---|---|---|
| Star rPHT 5 | 37,500 | 2.37 | 0.43 |
| Linear rPHT 6 | 11,100 | 1.28 | 0.73 |

The narrow Mw/Mn in the linear rPHT was due to the shorter polymer chain and the fact that oligomers have been removed during the purification process. The polymerization conditions for these two types of polymer are very similar. The PHT arms attached to the star polymer should be of similar length or shorter than those in the linear PHT material. This is because all PHT chains (long or short) become immobilized on the core and cannot be removed in the later purification process. Therefore, it is expected that in the star polymer, some arms will be significantly shorter than in the linear material. The relatively large Mw/Mn for the star rPHT indicates a broad molecular size distribution. A further advantage of the star versus linear PHT is revealed in that the star PHT synthesis is more efficient since a greater fraction of the thiophene units are immobilized and not lost as waste.

Thernal Characterization of Star and Linear rPHT. Both star and linear rPHT samples showed decomposition only above 400° C., as measured by thermogravimetric analysis (TGA). The star rPHT and prior art linear rPHT showed almost identical TGA traces indicating that the star branching structure had no obvious effect on their thermal stability.

Differential scanning calorimetry (DSC) was used to determine the polymer's glass transition temperature $T_g$ and crystalline melting point $T_m$. The results are summarized in Table 2.

TABLE 2

TGA and DSC Results on Polymer Samples

| Polymer Sample | $T_d$ (° C.)[a] | Melting | | Crystallization | |
|---|---|---|---|---|---|
| | | $T_m$ (° C.) | Q (J/g)[b] | $T_c$ (° C.) | Q (J/g)[b] |
| star rPHT | 461 | 230 | 18 | 183 | −16 |
| linear rPHT | 456 | 210 | 16 | 176 | −14 |

[a]$T_d$: Onset decomposition temperature;
[b]Q: heat of transition.

Figure 3:
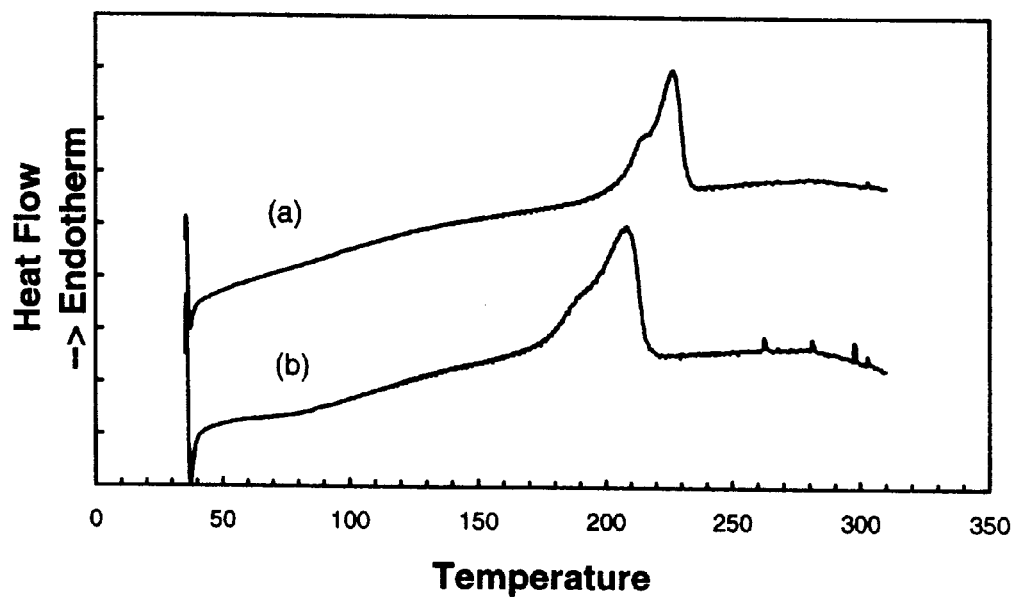
FIG. 3 is a differential scanning calorimeter trace comparing the melting (top) and freezing (bottom) transitions of a representative star conducting polymer with a hyperbranched 1,3,5 polyphenylene core and radiating regioregular poly(3-hexylthiophene) arms ("star rPHT") to that of a linear regioregular poly(3-hexylthiophene) material of prior art ("linear rPHT").
Figure 3:
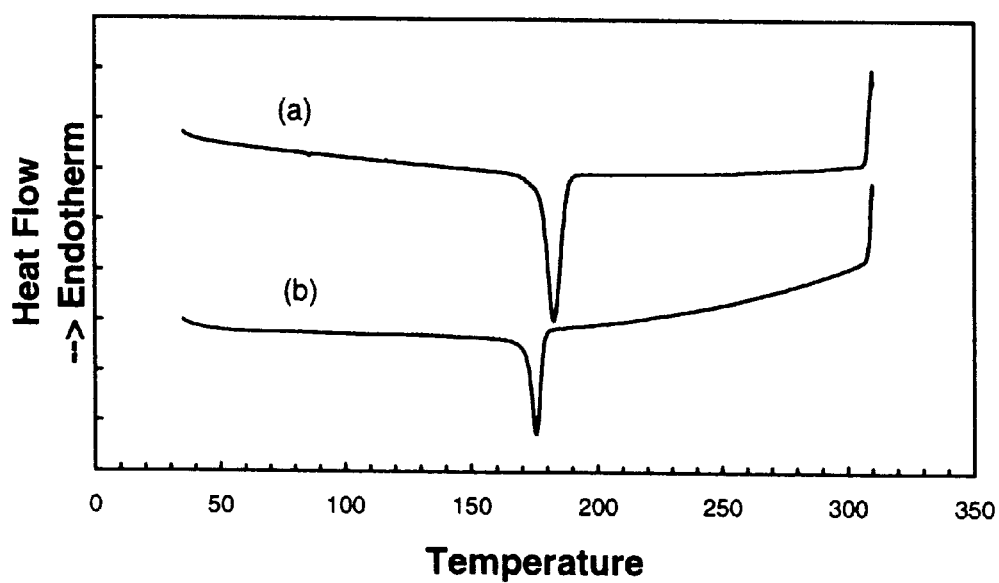

The DSC experiments were conducted using a Perkin Elmer DSC-7 differential scanning calorimeter. Samples of 4 to 7 mg were scanned from 35° C. to 310° C. at the rate of 10 ° C./min. Polymer samples obtained by precipitation in methanol and by film casting exhibit essentially identical thermal traces. The representative DSC trace of heating process for star rPHT and linear rPHT are shown in FIG. 3.

No evidence of solidification into a noncrystalline glassy phase was seen for either the star or linear rPHT products. Only the melting transition can be seen in the DSC traces, indicating that both the star and linear rPHT polymers are highly crystalline materials. In an attempt to obtain amorphous polymers, so that a glass transition temperature $T_g$ could be determined, samples were heated to 310° C. and quenched in liquid nitrogen. However, the quenched samples were still crystalline, exhibiting only melting endotherms at the temperature shown by the unquenched sample, indicating that crystallization is extremely rapid. This is quite surprising. Normally semicrystalline polymers can be readily quenched to the amorphous state by the liquid nitrogen process, only highly flexible, highly crystalline polymers such as polyethylene cannot be quenched in this way. The thermal behavior of these PHT polymers show they have very strong tendency to crystallize even in a very fast cooling process.

The DSC cooling process on rPHT polymers was also conducted to determine their possible glass transition temperature $T_g$ and crystallization point $T_c$. Samples were heated to 310° C. and held for 5 min. This was to ensure the full melting of the samples. Then it was scanned from 310° C. to 35° C. at the rate of 10° C./min. No $T_g$'s were observed in either the star or the linear PHT. Only a sharp crystallizing transition can be seen in the DSC traces, indicating that the star and linear rPHT polymers are highly crystalline materials.

A surprising differentiating feature is that the star rPHT shows a 20 degree higher $T_m$ than linear rPHT. For the similar polymers, a higher melting point means better crystalline perfection. The heat transition in the melting process for star rPHT is also slightly higher than that of linear rPHT. Similar to the melting process, the star polymer also shows a higher $T_c$ and slightly higher heat value in the crystallizing process. The differences in the melting and crystallizing process indicate that star rPHT has either larger or more ordered crystalline domains than linear rPHT.

Figure 4:
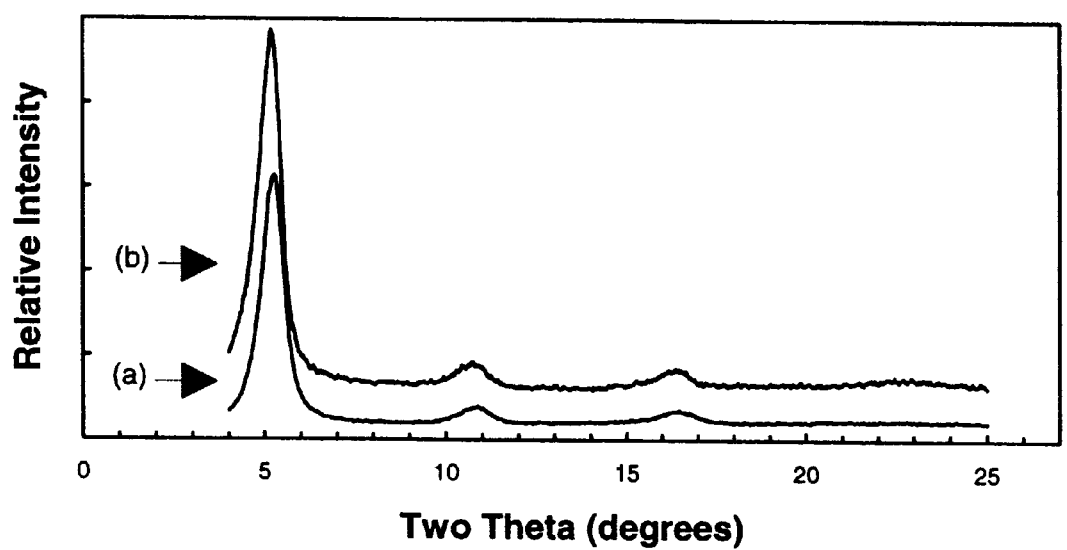
FIG. 4 is a x-ray diffraction pattern of star and linear rPHT.

X-Ray Characterization of Star and Linear PHT. The X-ray diffraction spectra of the star rPHT and linear rPHT polymer films are shown in FIG. 4. It can be seen that, surprisingly, the star polymer shows a pattern almost identical to that of linear rPHT provided in prior art (R. D. McCullough, S. Tristram-Nagle, S. P. Williams, R. D. Lowe, M. Jayaraman, J. Am. Chem. Soc. 115, 4910 (1993)). Both materials show the first-, second-, and third-order reflections at a 2θ angle of 5.2, 10.8, 16.4° corresponding to an interlayer d-spacing of about 17Å. This value is consistent with the d-spacing observed from regioregular and regiorandom PHT films, which represents the stacking distance of the thiophene rings between two polymer chains reported in the literature (M. J. Winokur, P. Wamsley, J. Moulton, P. Smith, A. J. Heeger, Macromolecules 24, 3812 (1991)).

This X-ray result indicates that at the sub-molecular level, i.e., at the polymer chain level, the star polymer and linear polymer are packing in a similar pattern. The half peak line widths of the 5.2° peak for both samples are the same indicating the perfection of crystallinity are similar in both type polymers. It is expected that due to the three dimensional structure of the star polymers, the crystalline domains formed in the star polymer film will be oriented in three directions. The results indicate that the local crystal structure within each domain are similar for both materials.

Microscopic Comparison of Surface Morphology of Star and Linear rPHT. The surface morphology of the films formed from star and linear rPHT showed very significant and surprising differences. Solutions of polymer 1% to 3% by weight in chloroform were cast on microscope glass slides and the solvent was allowed to evaporate in a covered petri dish. The covered petri dish created a semi-closed environment which allowed the solvent to evaporate slowly. Normally it takes about 20 min for a thin film to dry. The thickness of the films ranged from 1 to 5 µm. Very consistently, all the films from the star rPHT were visually shiny and mirror like. By contrast, the films from linear rPHT had a diffuse scattering, rough appearance. Scanning electron microscopy (SEM) results on these films confirmed the surface roughness of the linear rPHT films, whereas the star polymer film exhibited a smooth surface morphology at the level of magnification employed (1-100 µm features).

The differences in surface morphology were further characterized by atomic force microscopy (AFM). The AFM experiments were carried out using a Digital Instruments Nanoscope. The linear rPHT film displayed a rough and porous surface with larger domains (several µm) separated by pits ranging from 0.2 to 0.7 µm in depth. The star rPHT film showed a much smoother surface with smaller domains separated by pits less than 0.1 µm in depth. The root-mean-square (RMS) roughness for the star rPHT film was 20.8 nm in 50×50 µm scans, much less than the RMS roughness for the linear rPHT film of 196.6 nm in the same scan area. The average z range (z direction is perpendicular to the sample surface plane) for a typical star rPHT film was 31.4 nm whereas the z range for a typical linear rPHT was 229.6 nm.

Comparison of Electrical Conductivity and Doping of Star and Linear rPHT. Polythiophenes and numerous other conjugated polymers may be doped by inducing positive charges in the chains through reaction with oxidizing agents. Iodine was the first dopant used for investigation of the electrical conductivity on sample films. Upon exposing the films of both the star and linear rPHT films to $I_2$ vapor, their color changed to dark blue. The D.C. conductivities in the plane parallel to the surface were measured by the standard four-point probe technique at room temperature. The conductivity results are summarized in Table 3.

TABLE 3

Iodine Doping Results for Poly(3-hexylthiophene)s.

| | Conductivity of Star rPHT (S/cm) | Conductivity of Linear rPHT (S/cm) |
|---|---|---|
| before doping | $6.5 \times 10^{-4}$ | $7.4 \times 10^{-4}$ |
| after doping with $I_2$ for 5 hrs | 65 | 42 |

The doping of rPHT films with another oxidant, ferric chloride, was assessed in two different solvents. The results are summarized in Table 4.

TABLE 4

$FeCl_3$ Doping Results on Poly(3-hexylthiophene)s

| | Conductivity of Star rPHT (S/cm) | Conductivity of Linear rPHT (S/cm) |
|---|---|---|
| before doping | $2.5 \times 10^{-4}$ | $2.0 \times 10^{-4}$ |
| after doping with $FeCl_3/CH_3NO_3$ for 60 seconds | 10.9 | 3.5 |
| before doping | $1.2 \times 10^{-4}$ | $10^{-4}$ |
| after doping with $FeCl_3/CH_3OH$ for 30 min | 49 | Delaminated |

When $FeCl_3/CH_3OH$ solutions were used for doping, after a few minutes the star rPHT films delaminated from the glass slide in one piece. The linear rPHT film peeled and cracked into small pieces on doping. Hence an advantage of the star over the linear polymer is the ability to form free-standing doped films, a direct result of the improved morphology caused by a more compact and uniform structure.

The investigation of the electrical conductivity of these rPHT polymers revealed an improved conductivity for the star structure polymer. In addition, the star structures readily formed free standing thin films which suggests improved mechanical strength compared with their linear PHT.

Figure 5:
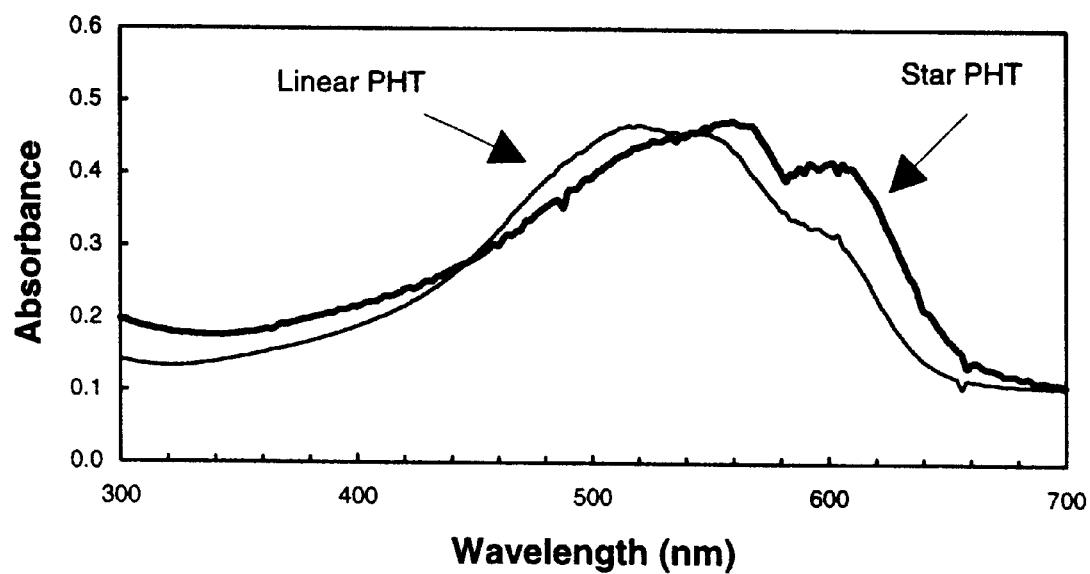
FIG. 5 is a visible spectrum of cast films of star and linear rPHT.

Visible Spectroscopic Properties of Star versus Linear PHT. The solid state visible spectra of solution cast films of the star and linear rPHT polymers are compared in FIG. 5. The linear rPHT film has a maximum optical attenuation at 518 nm with two shoulders at 541 and 600 nm. The star rPHT film, however, shows its maximum shifted to 558 nm, with secondary maxima at ~530 nm (shoulder) and at 600 nm. The relative intensities of the three peaks for the linear and star PHT materials are also significant. They are 1.42, 1.36 and 1.0 for the linear and 1.06, 1.16 and 1.0 for the star materials. The spectra of the linear PHT films are similar to those reported in prior art (McCullough et al., Journal of Organic Chemistry 58, 904 (1993)) where it was also suggested that the low energy peaks are indicative of the concentration of the most highly ordered domains. If so, we note that the star rPHT has a considerably higher relative intensity at 600 nm than the linear regioregular polyalkylthiophenes reported by McCullough et al. or herein. The energy of these $\pi$—$\pi$* electronic transition peaks is a qualitative indicator of the degree and extent of $\pi$ orbital overlap in the solid state resulting from aggregation of the thiophene chains. Thus, the spectral data indicate a higher concentration of domains with the most extensive interchain $\pi$ overlap in the star rPHT material. The observed further increase in the long-range order in star polymer film over the linear systems may result from the formation of a three dimensional rather than laminar packing structures.

Figure 6:
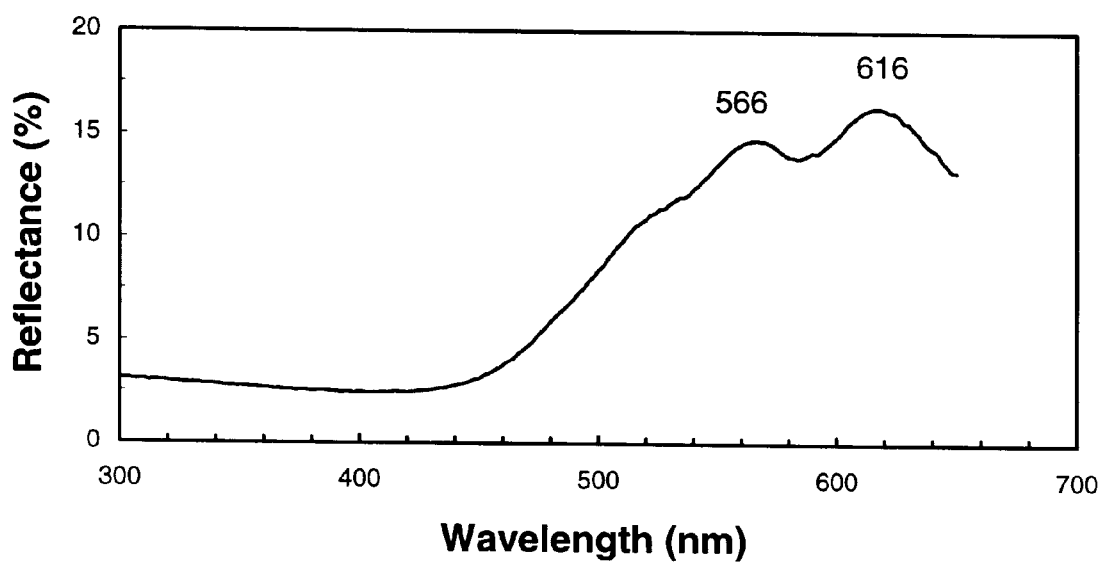
FIG. 6 is a 45° specular reflectance spectrum of star and linear rPHT.

A reflectance spectrum over the visible wavelength region further differentiates the star rPHT from the linear rPHT. FIG. 6 shows specular reflectance spectra of the solution cast films of the two polymers obtained at 45° incidence. Specular reflectance only captures the reflected light within a very narrow angle and hence is particularly sensitive to surface roughness which results in light being reflected diffusely. The linear rPHT shows negligible specular reflectance while that of a typical star rPHT sample is approximately 0.2 at its wavelength maximum. Note that this measurement excludes light reflected off at different angles so cannot be used as a measure of the total reflectance of the films. The measurement is in agreement with the visual observation that the star rPHT films are consistently lustrous and golden, appearing like a metallic gold coating and providing a mirror-like reflecting surface with little image distortion. The linear rPHT films are consistently rough and matted and images are not seen clearly reflected off the surface.

The foregoing description and examples are only illustrative of the invention and should not be construed as limiting in scope. Those skilled in the art may devise various alternatives and modifications which do not depart from the scope of the invention. Thus the scope of the invention should be determined by the appended claims rather than by the examples given above.

What is claimed is:

1. An electrically conductive polymer comprising a) a hyperbranched polymer core structure providing a multiplicity of attachment points and b) nonbranching conjugated backbone chains radiating from the attachment points in three dimensions said polymers exhibiting improved properties chosen from the properties group of lower melting temperature, higher electrical conductivity and lower surface roughness compared to polymers comprising the conjugated backbone chains alone.

2. The polymers of claim 1 wherein the core structure providing a multiplicity of branching points is a 1,3,5 hyperbranched polyphenylene and said conjugated backbone chain is chosen from the group of conjugated chains consisting of polythiophene and oligothiophene chains.

3. The polymers of claim 2 wherein the thiophene chains are substituted in the 3-position with alkyl groups.

4. The polymers of claim 3 wherein the alkyl groups are hexyl.

5. The polymers of claim 1 wherein the conjugated structural units are regioregular.

6. A coating made of the electrically conductive polymer of claim 1 with a specular reflectance at its wavelength maximum exceeding 0.1.

7. The coating of claim 6 prepared by solution casting.

8. The electrically conductive polymers of claim 1 doped by treatment with an oxidizing or reducing agent and further incorporating a source of charge compensating ions.

9. The electrically conductive polymers of claim 1 doped electrochemically and further incorporating a source of charge compensating ions.

10. The polymers of claim 1 wherein the conjugated backbone chains are made from polyaniline or polyaniline derivatives.

11. The polymers of claim 10 doped by treatment with an acid.

12. The polymers of claim 11 wherein the conjugated backbone chains are made from polyphenylene or substituted polyphenylene.

13. The polymers of claim 12 wherein the substituents are hexyloxy.

14. An electrically conductive polymer comprising a) a dendrimer core structure providing a multiplicity of attachment points and b) nonbranching conjugated backbone chains radiating from the attachment points in three dimensions said polymers exhibiting improved properties chosen from the properties group of lower melting temperature, higher electrical conductivity and lower surface roughness compared to polymers comprising the conjugated backbone chains alone.

15. An electrically conductive polymer comprising a) a fullerene core structure providing a multiplicity of attachment points and b) nonbranching conjugated backbone chains radiating from the attachment points in three dimensions said polymers exhibiting improved properties chosen from the properties group of lower melting temperature, higher electrical conductivity and lower surface roughness compared to polymers comprising the conjugated backbone chains alone.

* * * * *